United States Patent [19]

Miyashita et al.

[11] Patent Number: 5,297,480
[45] Date of Patent: Mar. 29, 1994

[54] HIGH VACUUM HOT PRESS

[75] Inventors: Akimi Miyashita, Toride; Hazime Sato, Iwamamachi; Mutsumasa Fujii, Chiyodamachi; Isao Koromegawa, Tsuchiura; Katsunori Shibata, Kashiwa, all of Japan

[73] Assignee: Hitachi Techno Engineering Co., Ltd., Tokyo, Japan

[21] Appl. No.: 879,247

[22] Filed: May 6, 1992

[30] Foreign Application Priority Data

May 9, 1991 [JP] Japan .................. 3-104232

[51] Int. Cl.$^5$ .......... B30B 9/00; B30B 15/34
[52] U.S. Cl. ............... 100/90; 100/93 P; 156/382; 156/583.1; 219/243; 425/407; 425/509
[58] Field of Search ........ 100/90, 93 P; 156/286, 156/381, 382, 583.1; 219/243; 425/405.1, 407, 504, 508, 509

[56] References Cited

U.S. PATENT DOCUMENTS

| | | | |
|---|---|---|---|
| 3,551,952 | 1/1971 | Morse | 100/93 P |
| 3,555,597 | 1/1971 | Meadows | 425/407 X |
| 3,619,310 | 11/1971 | Clarke | 100/93 PX |
| 3,971,875 | 7/1976 | Regalbuto | 219/243 |
| 4,963,221 | 10/1990 | Isobe et al. | 100/93 PX |

FOREIGN PATENT DOCUMENTS

| | | |
|---|---|---|
| 62-156931 | 7/1987 | Japan . |
| 62-211129 | 9/1987 | Japan ........ 156/583.1 |
| 63-130300 | 6/1988 | Japan ........ 425/405.1 |
| 1-253426 | 10/1989 | Japan ........ 156/382 |
| 2-224900 | 9/1990 | Japan ........ 100/93 P |

OTHER PUBLICATIONS

English Language Abstract 62-156931 (A) Jul. 1987.

*Primary Examiner*—Stephen F. Gerrity
*Attorney, Agent, or Firm*—Antonelli, Terry, Stout & Kraus

[57] ABSTRACT

A high vacuum hot press for producing a multi-layer board. The high vacuum hot press includes a pair of heat insulating members each comprising a heat insulating material and a thin metallic cover defining an evacuated hermetic space accommodating therein the heat insulating material. The heat insulating members are arranged on respective surfaces, facing each other on a pair of bolsters. A pair of hot plates are placed on the heat insulating members, respectively. A multi-layer workpiece is disposed between the hot plates in a sealed space in a sealing unit. The multi-layer work includes wafers and an adhesive base material. The sealed space is evacuated to a high vacuum by an evacuating unit, and the multi-layer workpiece is heated by a heating unit under a high vacuum. The high vacuum hot press is further provided with a bonding unit which shifts the bolsters relative to each other to open and close the sealing unit and to bond the wafers of the multi-layer workpiece to each others for producing the multi-layer board.

4 Claims, 6 Drawing Sheets

HIGH VACUUM HOT PRESS

BACKGROUND OF THE INVENTION

1. Field of the Invention

The present invention relates to a high vacuum hot press for heating and pressing a multi-layer workpiece including boards such as, for example, printed wiring boards, ceramic boards and covered boards, and an adhesive, so as to produce a multi-layer board, such as a multi-layer printed wiring board and, more particularly, to a high vacuum hot press which is suitable for fabricating multi-layer boards in a relatively short time and at a high accuracy.

2. Prior Art

In the fabrication of high density multi-layer boards by hot presses, a higher finishing accuracy and warp and twist resistance have been required for the boards. To meet and satisfy this requirement, a typical attempt is disclosed in Japanese Laid-Open Patent Publication 62-156931 in which a pair of hot plates heat a multi-layer workpiece, whereas, a pair of bolsters press the workpiece through the respective hot plates. A heat insulating material is interposed between each pair of the hot plates and the corresponding bolster for uniform heating of the workpiece to remove thermal strains therefrom.

SUMMARY OF THE INVENTION

Accordingly, it is an object of the present invention to provide a high vacuum hot press which is capable of efficiently producing high density multi-layer boards which are free from oxide films and voids in bonded portions thereof, whereby it is possible to produce a multi-layer board having a fairly high degree of finishing accuracy as compared with conventional multi-layer boards.

To this end, the present invention provides a high vacuum hot press including a pair of opposed bolsters each having surfaces facing each other and a pair of hot plates each arranged on a surface of the corresponding bolster through heat insulating means. The hot plates are adapted to hold therebetween a multi-layer workpiece including wafers and an adhesive base material means disposed between the bolsters and defining a sealed space hermetically enclosing the heat plates and the heat insulating means. Means are provided for shifting the bolsters relative to each other so as to press the workpiece, with the evacuating means evacuating the sealed space in the enclosing means to a high vacuum. A heat source heats the hot plates to heat the workpiece within the sealed space at the high vacuum to thereby bond the wafers of the multi-layer workpiece by curing the adhesive base material, wherein the heat insulating means comprises a heat insulating material and a thin metallic cover to define therein a hermetic space hermetically accommodating the heat insulating material.

As described above, the sealed space is defined in the enclosing means between the two bolsters and, in the sealed space, the heat insulating means are disposed, with each heat insulating means including the heat insulating material and the metallic cover defining therein the hermetic space accommodating the heat insulating material. The hot plates are placed, through the intermediary of the heat insulating means, on the respective surfaces of the bolsters. The multi-layer workpiece is held between the hot plates. When the sealed space is evacuated to a high vacuum by the evacuating unit, a trace amount of air between the wafers of the multi-layer workpiece, air in the space, and moisture in the air are removed. Since the heat insulating material contains a content of gases greater than that of the multi-layer workpiece, the atmosphere surrounding the heat insulating material and the atmosphere in which the multi-layer workpiece is located, are separated by the metallic cover. By virtue of the provision of the metallic cover, the multi-layer workpiece is thus prevented from being affected by evacuation, and moreover gases held in the heat insulating material are prevented from being discharged. For this reason, the sealed space may be rapidly evacuated to a high vacuum of about 0.001 Torr, and this enables the bonded portions of the multi-layer board to be free from oxide films and voids. Furthermore, since the multi-layer workpiece may be heated and pressed uniformly due to the provision of the heat insulating means, the thus produced multi-layer board is prevented from being warped or twisted, whereby it is possible to produce multi-layer boards at a high degree of finishing accuracy.

Preferably, the hermetic space which accommodates the heat insulating material is held in an evacuated state. It is thus possible to prevent the interior of the metallic cover from being inflated even if the space, defined by the sealing means, is evacuated to a high vacuum. This enables a multi-layer workpiece to be uniformly heated under pressure.

Furthermore, the thin metallic cover may be communicated with the evacuating means through exhaust passage means for evacuating the hermetic space. With this arrangement, the evacuating means is used both for evacuating the sealed space in the enclosing means and the hermetic space in the thin metallic cover. Moreover, when the space defined by the enclosing means is evacuated, the thin metallic cover is not likely to be inflated due to the inner pressure thereof since the thin metallic cover is also evacuated. Thus, the multi-layer workpiece may be uniformly heated and pressed.

Preferably, the exhaust passage means comprises a duct for communicating the thin metallic cover with the evacuating means, and a restrictor valve arranged in the duct for restricting air flow in the duct.

DETAILED DESCRIPTION

Figure 1:
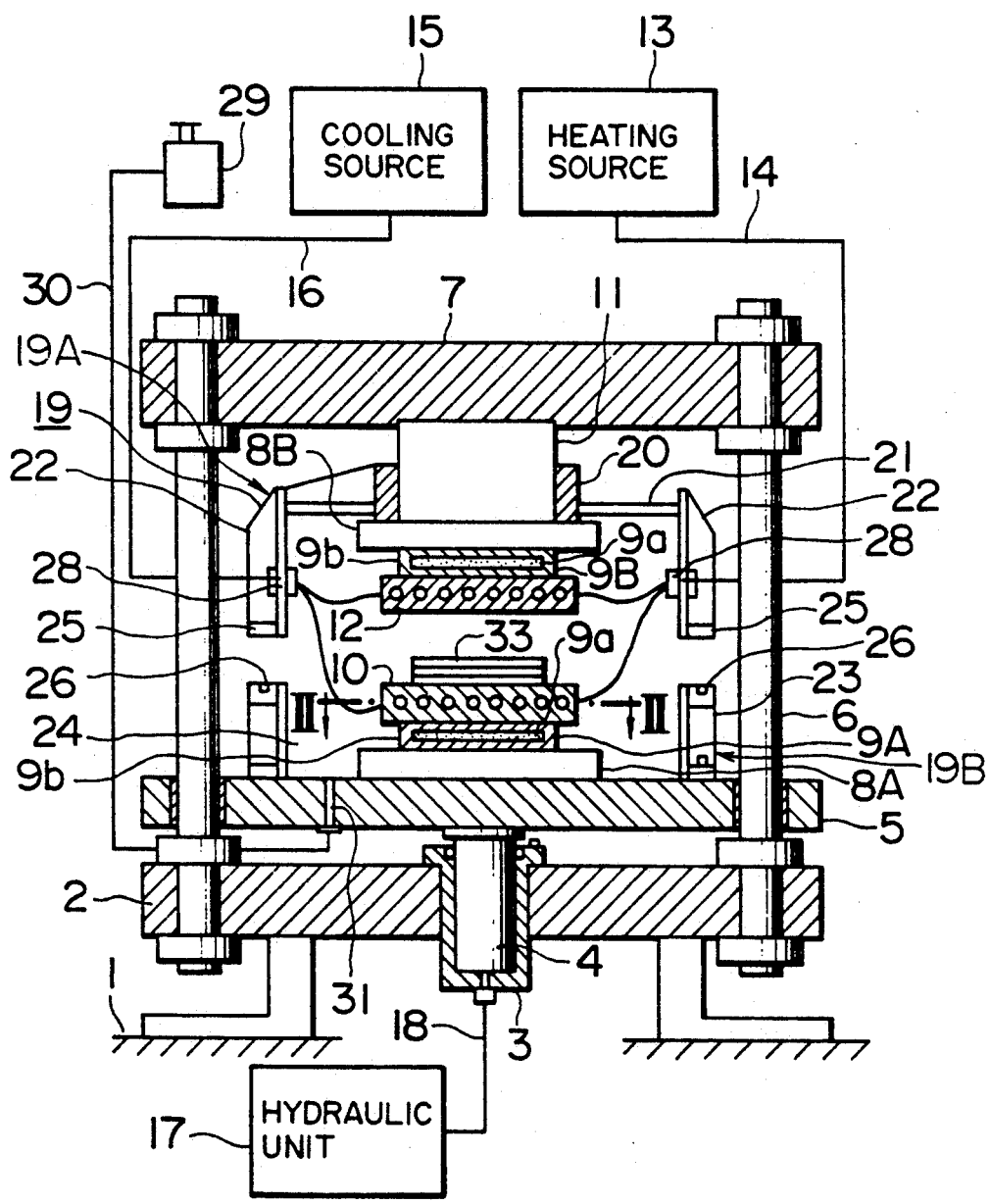
FIG. 1 is a vertical cross-sectional view illustrating a high vacuum hot press constructed in accordance with the present invention.

Referring now to the drawings wherein like reference numerals are used throughout the various views to designate like parts and, more particularly, to FIG. 1, according to this figure, a high vacuum hot press according to the present invention includes a base frame 2 mounted or installed on a floor or support surface 1, with posts 6 secured, at lower ends thereof, to the base frame 2 and with upper ends of the posts 6 supporting an upper bolster 7 fixed thereto. The posts 6 pass through a lower bolster 5 which is vertically movable between the upper bolster 7 and the base frame 2. The base frame 2 is provided at a central portion thereof with a hydraulic cylinder 3 which is connected to a hydraulic unit 17, including a pump, a pipe 18 and the like. A ram 4, flanged at an upper end thereof to abut the lower bolster 5, is slidably disposed in the hydraulic cylinder 3. On the upper surface of the lower bolster 5 there is mounted a lower hot plate 10 through a bolster auxiliary plate 8A and a heat insulating plate 9A. The upper bolster 7 is attached at a lower surface thereof with an upper hot plate 12 through a bolster auxiliary plate 8B and a heat insulating plate 9B in a face-to-face relationship with respect to the lower hot plate 10.

Figure 2:
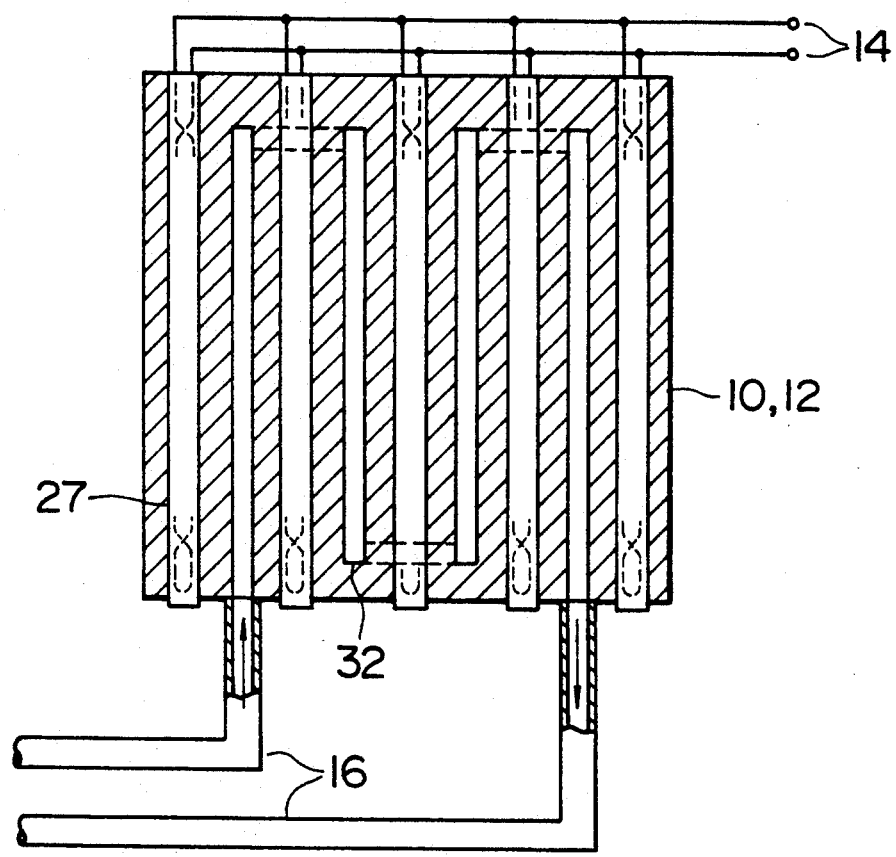
FIG. 2 is an enlarged view taken along the line II—II of a lower hot plate of the hot press of FIG. 1.

As illustrated in FIG. 2, the upper and lower hot plates 12 and 10 are each provided therein with a heater 27 such as, for example, an electric heater. The heater 27 is connected to a heating source 13 such as a power source, through heating lines 14 such as electric wires for heating the lower hot plate 10 and the upper hot plate 12. Each of the lower hot plate 10 and the upper hot plate 12 is cooled by a coolant which is supplied thereto through a coolant passage 32 arranged in the lower hot plate 10 and the upper hot plate 12, from a cooling source 15 by way of cooling hoses 16. Each of the heat insulating plates 9A and 9B includes a heat insulating material 9a and a thin metallic cover 9b which covers the entire surface of the heat insulating material 9a. The heat insulating material 9a emits gases contained in it under reduced pressure. The thin metallic cover 9b is made of a thin metallic sheet such as 0.6 mm stainless steel. The thin metallic cover 9b serves to suppress emission of gases from the heat insulating material 9a, and to reduce thermal conduction from the upper and lower hot plates 12 and 10 to the upper and lower bolsters 7 and 5.

A sealing unit 19 is disposed between the upper and lower bolsters 7, 5, and includes an upper assembly 19A attached to a tubular guide 11 vertically mounted to the upper bolster 7 and a lower assembly 19B mounted to the upper surface of the lower bolster 5. The upper assembly 19A includes a supporting ring 20 vertically slidably fitted on the tubular guide 11, an annular plate 21 horizontally and concentrically mounted around the supporting ring 20, and an upper cylindrical tube 22 concentrically disposed with respect to the outer periphery of the annular plate 21.

Figure 3:
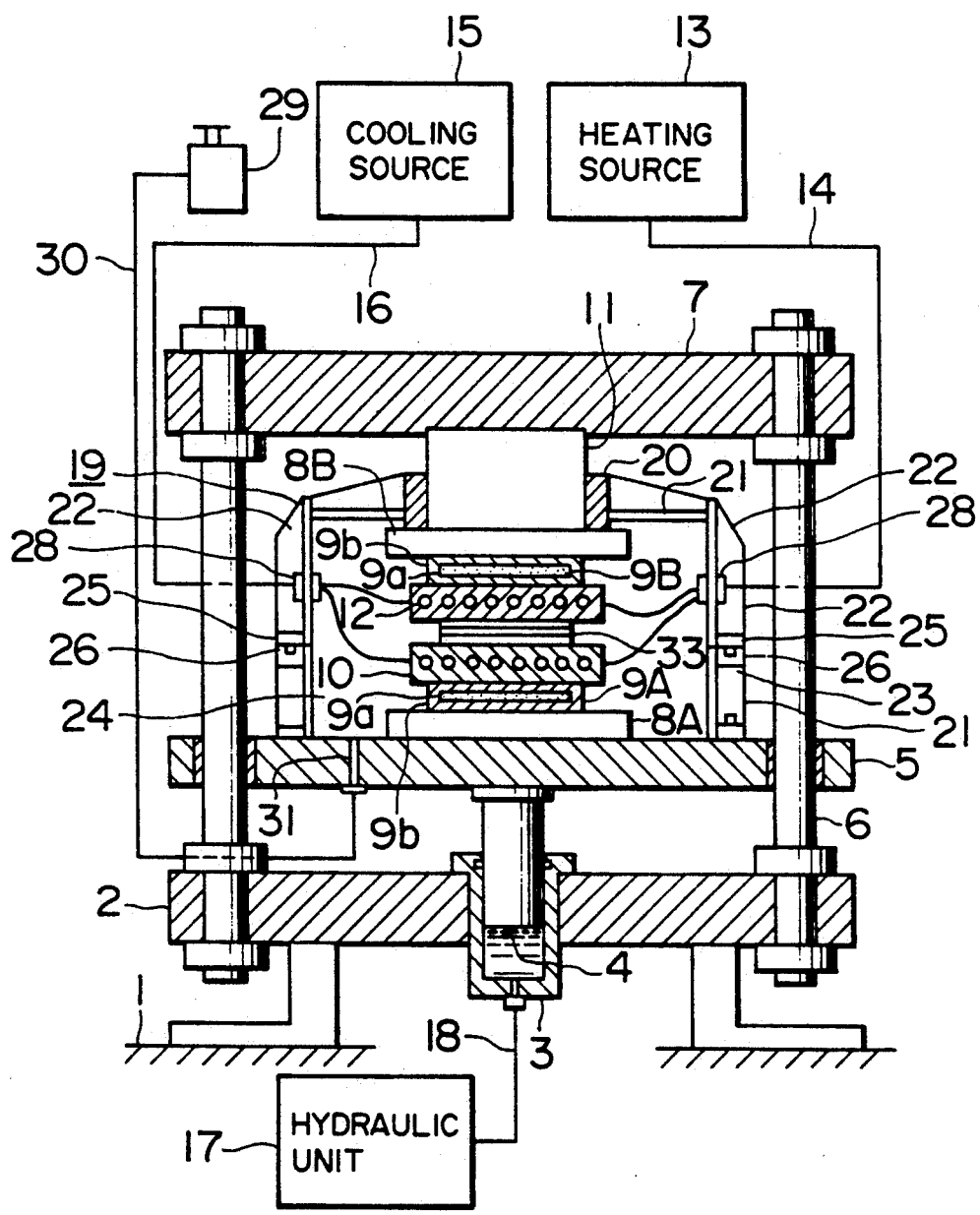
FIG. 3 is a vertical cross-sectional view illustrating the high vacuum hot press of FIG. 1 with the sealing unit being hermetically closed.
Figure 4:
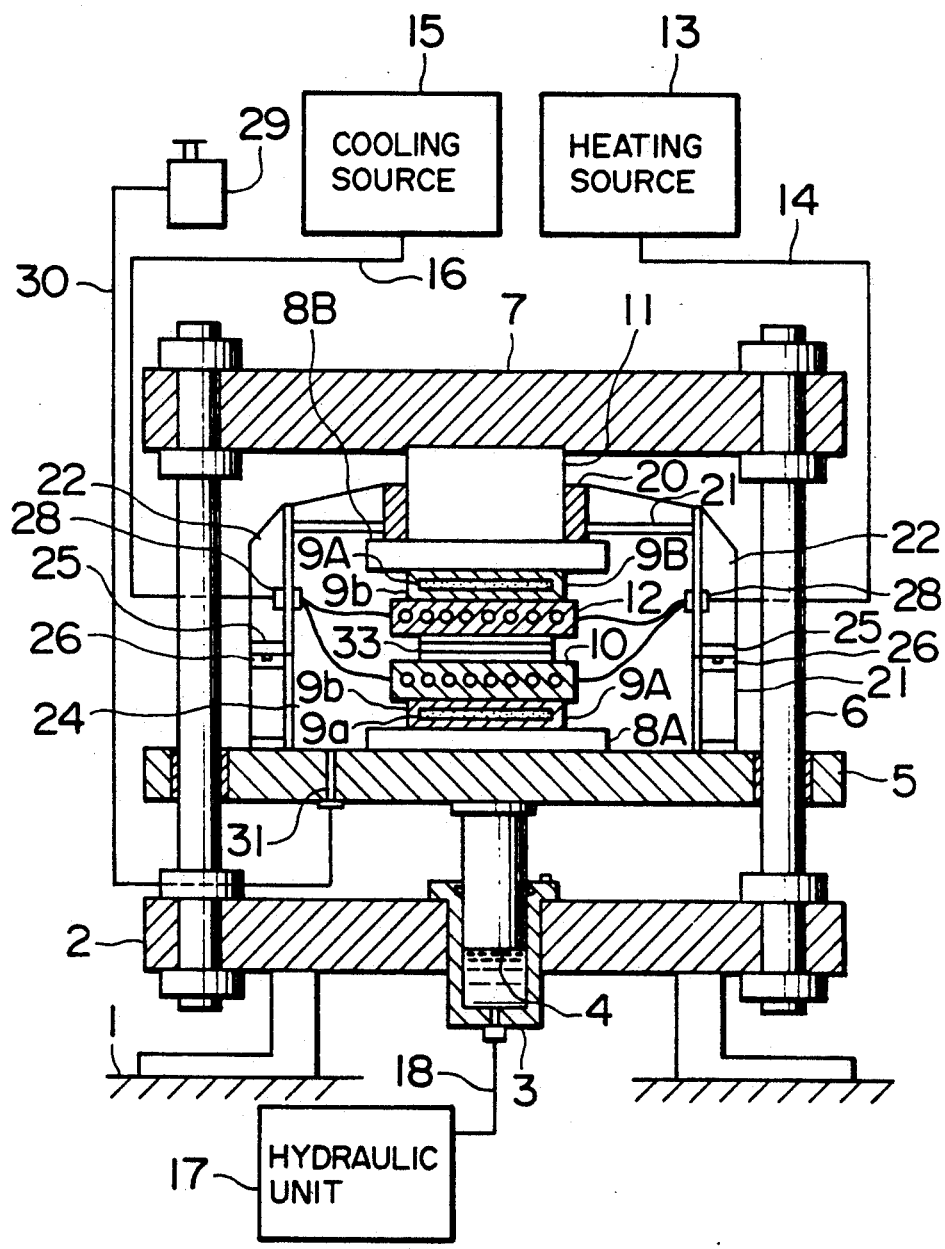
FIG. 4 is a vertical cross-sectional view illustrating the high vacuum hot press of FIG. 1 in an evacuated heated state.

The lower assembly 19B includes a lower cylindrical tube 23 vertically mounted on the upper surface of the lower bolster 5 so that the lower cylindrical tube 23 is coaxial with and equal in diameter to the upper cylindrical tube 22. The upper cylindrical tube 22 and the lower cylindrical tube 23 are provided at their distal ends with engaging members 25 and 26 which are hermetically engaged with each other so as to define a sealed space 24 which is surrounded by a tubular guide 11, the annular plate 21, the upper cylindrical tube 22, the lower cylindrical tube 23 and the lower bolster 5, when they are closed as shown in FIG. 3.

The upper cylindrical tube 22 is provided with terminals 28 for electric wires or heating hoses 14 and for cooling hoses 16. The lower bolster 5 has an exhaust port 31 formed therethrough for connecting the sealed space 24 to an evacuating unit 29 including a vacuum pump, through an evacuating duct 30. When the sealed space 24 is hermetically closed, air in the sealed space 24 is evacuated by the evacuating unit 29. The reference numeral 33 designates a workpiece for a multi-layer board, that is, a multi-layer workpiece.

In operation, hydraulic oil is discharged from the hydraulic cylinder to the hydraulic unit 17 through the pipe 18 so that the ram 4 and the lower bolster 5 descend, under gravity, as shown in FIG. 1. As a result, the lower cylindrical tube 23 of the sealing unit 19 is lowered, and the upper and lower engaging members 25, 26 of the upper and lower cylindrical tube 22, 23 are separated from each other so as to form a gap therebetween. The workpiece 33 is inserted through the gap and is placed on the lower hot plate 10. In this event, the supporting ring 20, the annular plate 21 and the upper cylindrical tube 22 of the sealing unit 19 are held on the bolster auxiliary plate 8B which serves as a flange for the tubular guide 11.

Then, hydraulic oil is supplied from the hydraulic unit 17 to the hydraulic cylinder 3 for elevating the ram 4 and the lower bolster 5 by hydraulic pressure, so that the lower cylindrical tube 23 is raised. This causes the engaging member 26, mounted on the upper edge of the lower cylindrical tube 23, to be brought into engagement with the upper engaging member 25 as shown in FIG. 3, thus placing the space 24 in a sealed state. Then the sealed space 24 is evacuated by the evacuating unit 29 via the exhaust port 31 and the evacuating duct 30 up to a high vacuum of about 0.001 Torr. Under this reduced pressure, supplying hydraulic oil into the hydraulic cylinder 3 is continued, and the lower bolster 5 is therefore further elevated. This causes the upper assembly 19A to be lifted along the tubular guide 11 by the lower cylindrical tube 23, with the engaging member 26 being hermetically engaged with the engaging member 25 since the supporting ring 20 is guided by the tubular guide 11. Simultaneously, the lower hot plate 10 is raised so that the workpiece 33 is clamped between the lower hot plate 10 and the upper hot plate 12. In this event, a preliminary surface pressure of 0.5 to 5 Kg/cm$^2$ is applied to the workpiece 33. Furthermore, heat is transmitted from the heating source 13 to the heater 27 through the electric heating lines 14 so that the upper and lower hot plates 12 and 10 are heated to a predetermined bonding temperature. The bonding temperature depends upon the workpiece 33 and is usually about 60° to 450° C. Before the temperature of the workpiece 33 reaches this temperature, gas and volatile solvents contained in the adhesive are expelled.

When the workpiece 33 is heated to a predetermined bonding temperature, hydraulic oil is further fed from the hydraulic unit 17 to the hydraulic cylinder 3. This causes the lower bolster 5 to be further elevated through the ram 4 by hydraulic pressure so that the upper assembly 19A is lifted along the tubular guide 11 by the lower cylindrical tube 23, with the engaging member 26 being hermetically engaged with the engaging member 25. Simultaneously, the lower hot plate 10 is also elevated for further clamping the workpiece 33 between the lower hot plate 10 and the upper hot plate 12. In this event, a bonding surface pressure of 1 to 20 Kg/cm$^2$ is applied to the workpiece 33 for about five to twenty minutes.

After the bonding operation, the bonding portion of the workpiece 33 are held at a temperature for stabilizing them. Thereafter, the heating source 13 is turned off, and a coolant is supplied to the coolant passage 32 from the coolant source 15 through a coolant hose 16 for cooling the workpiece 33 through the upper and lower hot plates 12 and 10 down to a temperature at which the thus obtained multi-layer board can be taken out. When the multi-layer board is cooled to this temperature, hydraulic oil in the hydraulic cylinder 3 is returned to the hydraulic unit 17 through the pipe 18. This causes the ram 4 to lower the lower bolster 5 so that a gap is formed between the engaging member 26 of the lower cylindrical tube 23 and the engaging member 25 of the upper cylindrical tube 22. Then, the bonded multi-layer board is taken out from the sealing unit 19 through the gap, and a new workpiece 33 is placed on the lower hot plate 12 for repeating the operation as described hereinabove.

In this embodiment, the heat insulating material 9a is sealed in a thin metallic cover 9b which is formed of a thin metallic sheet and is therefore not subjected to the influence of evacuation even under the repressurized and heated state. No gas which is contained in the heat insulating material 9a is emitted into the atmosphere of the space 24 in which the workpiece 33 is disposed. The space 24 can therefore be evacuated up to a sufficiently high vacuum, and accordingly, the bonded portions of the thus produced multi-layer boards are free from oxide films and voids. Since the workpiece 33 is uniformly heated due to the provision of the heat insulating material 9a under pressure, multi-layer boards which are free from warp and twist can be produced with a high degree of accuracy.

Figure 5:
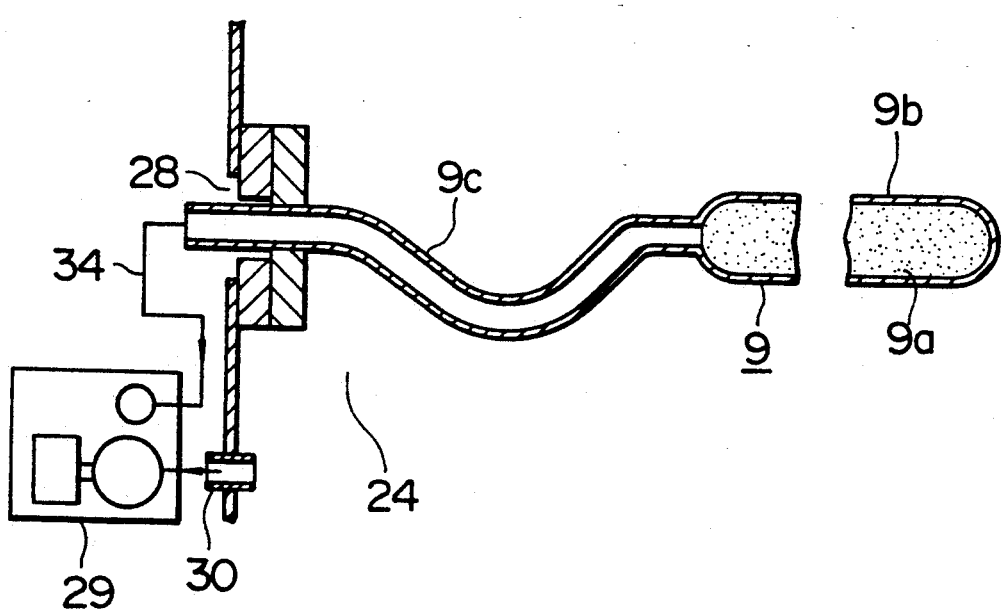
FIG. 5 is a view illustrating a heat insulating plate and an evacuating system of a high pressure hot press of another embodiment of the present invention.

In the embodiment of FIG. 5, a heat insulating material 9a, in a heat insulating member 9, is sealingly covered with a thin metallic cover 9b made of a stainless steel sheet having a thickness of, for example, 0.6 mm. This stainless steel sheet has a relatively low heat conductivity, has excellent welding properties, and has less gas emission at a high temperature. A pipe 9c is connected at one end to a peripheral portion of the thin metallic cover 9b for evacuating the heat insulating material 9a while the other end thereof is communicated to an evacuating unit 29 through an exhaust port 34.

According to the embodiment of FIG. 5, when the space defined by the upper and lower cylindrical tubes 22 and 23 is evacuated, the thin metallic cover 9b is not likely to be inflated due to the inner pressure of the heat insulating material 9a. The workpiece 33 may be uniformly heated and pressurized. The hermetic space defined in the thin metallic cover 9b of the previously described embodiment may be evacuated, with the heat insulating material 9a being hermetically held in the thin metallic cover 9b.

Figure 6:
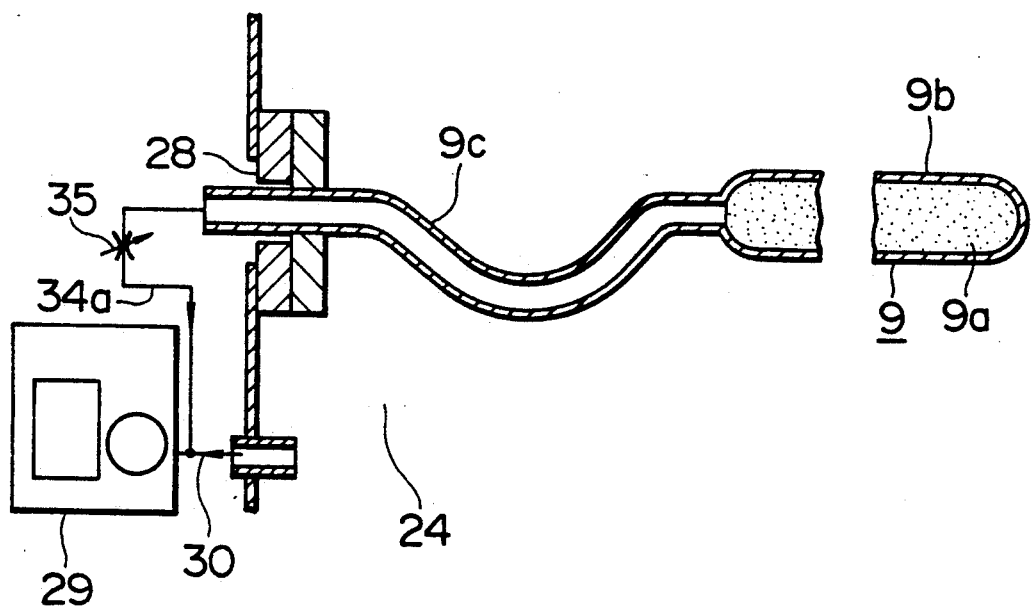
FIG. 6 is a view illustrating the heat insulating plate and evacuating system of the high pressure hot press of a still further embodiment of the present invention.

The embodiment of FIG. 6 differs from the embodiment shown in FIG. 5 in that a restrictor valve 35 is provided in an exhaust duct 34a, and the exhaust duct 34a is connected to the exhaust duct 30. With this arrangement, the structure of exhaust line is further simplified.

What is claimed is:

1. A high vacuum hot press including a pair of bolsters arranged to have surfaces opposed to each other; a pair of hot plates each arranged on the surface of the corresponding bolster through heat insulating means and adapted to hold therebetween a multi-layer workpiece including wafers and an adhesive base material; means, disposed between the bolsters, for hermetically enclosing said hot plate and said heat insulating means and defining therein a sealed space; means for shifting said bolsters relative to each other so as to press said workpiece; evacuating means for evacuating the sealed space in the enclosing means to a high vacuum; a heat source for heating the hot plates to heat the workpiece within the sealed space at the high vacuum to thereby bond the wafers of the multi-layer workpiece to each other by curing the adhesive base material, wherein the heat insulating means comprises a thin metallic cover and a heat insulating material enclosed by said thin metallic cover, said thin metallic cover defining a hermetic space in which said heat insulating material is hermetically accommodated.

2. A high vacuum hot press as set forth in claim 1, wherein means is provided for bringing said hermetic space into an evacuated state.

3. A high vacuum hot press as set forth in one of claims 1 or 2, further comprising exhaust passage means communicating said hermetic space with the evacuating means for evacuating the hermetic space.

4. A high vacuum hot press as recited in claim 3, wherein the exhaust passage means comprises a duct communicating said hermetic space with the evacuating means, and a restrictor valve arranged in the duct for restricting air flow in the duct.

* * * * *